(12) United States Patent
Peng et al.

(10) Patent No.: US 11,538,754 B2
(45) Date of Patent: Dec. 27, 2022

(54) RANDOM CUT PATTERNING

(71) Applicant: Taiwan Semiconductor Manufacturing Company Limited, Hsinchu (TW)

(72) Inventors: Shih-Wei Peng, Hsinchu (TW); Wei-Cheng Lin, Taichung (TW); Chih-Ming Lai, Hsinchu (TW); Jiann-Tyng Tzeng, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 30 days.

(21) Appl. No.: 17/233,714

(22) Filed: Apr. 19, 2021

(65) Prior Publication Data

US 2021/0242130 A1    Aug. 5, 2021

Related U.S. Application Data

(62) Division of application No. 16/512,453, filed on Jul. 16, 2019, now Pat. No. 11,024,580.

(51) Int. Cl.
*H01L 23/528* (2006.01)
*H01L 23/522* (2006.01)
*H01L 21/768* (2006.01)
*H01L 23/48* (2006.01)

(52) U.S. Cl.
CPC .... *H01L 23/5286* (2013.01); *H01L 21/76816* (2013.01); *H01L 21/76877* (2013.01); *H01L 21/76898* (2013.01); *H01L 23/481* (2013.01); *H01L 23/5226* (2013.01)

(58) Field of Classification Search
CPC ......... H01L 21/76816; H01L 21/76877; H01L 21/76898; H01L 23/481; H01L 23/5226; H01L 23/5286
See application file for complete search history.

(56) References Cited

U.S. PATENT DOCUMENTS

| 2005/0051831 | A1  | 3/2005 | Kajimoto et al. |
| 2009/0160062 | A1* | 6/2009 | Park .................... H01L 23/5226 438/599 |
| 2009/0184426 | A1  | 7/2009 | Choi |
| 2019/0286784 | A1  | 9/2019 | Chang et al. |

* cited by examiner

*Primary Examiner* — Allan R Wilson
(74) *Attorney, Agent, or Firm* — Jones Day (57) ABSTRACT

Methods and devices are described herein for random cut patterning. A first metal line and a second metal line are formed within a cell of a substrate and extend in a vertical direction. A third metal line and a fourth metal line are formed within the cell and are perpendicular to the first metal line and the second metal line, respectively. A first circular region at one end of the first metal line is formed using a first patterning technique and a second circular region at one end of the second metal line is formed using a second patterning technique. The first circular region is laterally extended using a second patterning technique to form the third metal line and the second circular region is laterally extended using the second patterning technique to form the fourth metal line.

20 Claims, 10 Drawing Sheets

RANDOM CUT PATTERNING

CROSS-REFERENCE TO RELATED APPLICATION

This application is a divisional application of U.S. patent application Ser. No. 16/512,453, filed Jul. 16, 2019, which is incorporated herein by reference in its entirety.

FIELD

The technology described in this disclosure relates generally to electronic devices and more particularly to integrated circuits.

BACKGROUND

Moore's law illustrates a trend that the number of transistors within a dense integrated circuit (IC) doubles approximately every two years. In addition to becoming denser, overall chip volume (e.g., the amount of physical space a chip occupies) is also decreasing. Packing more transistors into a smaller volume can cause design and fabrication issues, such as lack of pin access or routing congestion on a chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moore's law illustrates a trend of packing of more transistors into a smaller chip area. Such packing can cause design and fabrication issues, such as lack of routing pin access or routing congestion on a chip. For example, a traditional power distribution network (PDN) for a semiconductor device may be constructed above one or more circuits embedded on a substrate (i.e., cells). This traditional PDN shares metal resources of the cells, where such metal resources facilitate routing of signals through the circuits. During fabrication of cells, a trim mask or a cut mask is used to either retain a portion of the design layout corresponding to an electrical component of the cell or to remove a portion of the design layout that does not correspond to an electrical component. Additionally, a mask can define a cut location for routing pin placement. Traditional masks include a preferred cut location for routing.

Having a PDN above the circuits increases the cell height of the semiconductor device, and in turn burdens the ability to add additional transistors to a semiconductor device. In order to decrease an overall cell height, some cell designs utilize thinner metal for signal routing or narrower metal widths. Such a design can cause an overall voltage drop of a semiconductor device. In order to free up volume in a semiconductor device for more transistors, a PDN can be placed on the backside (i.e., below the substrate) of the semiconductor device. This backside PDN typically maintains an acceptable voltage drop across the semiconductor device and minimizes signal routing impacts that can occur in the traditional PDN design. With a backside PDN, the overall cell height can also decrease (e.g., can be a cell height of approximately 50-100 nm). But traditional preferred cut pin routing with this cell height decrease may not offer enough pin access for a given device. The use of random cut patterning as described herein can provide a flexible cut location and increase routing pin access for cells with shorter cell heights.

Figure 1:
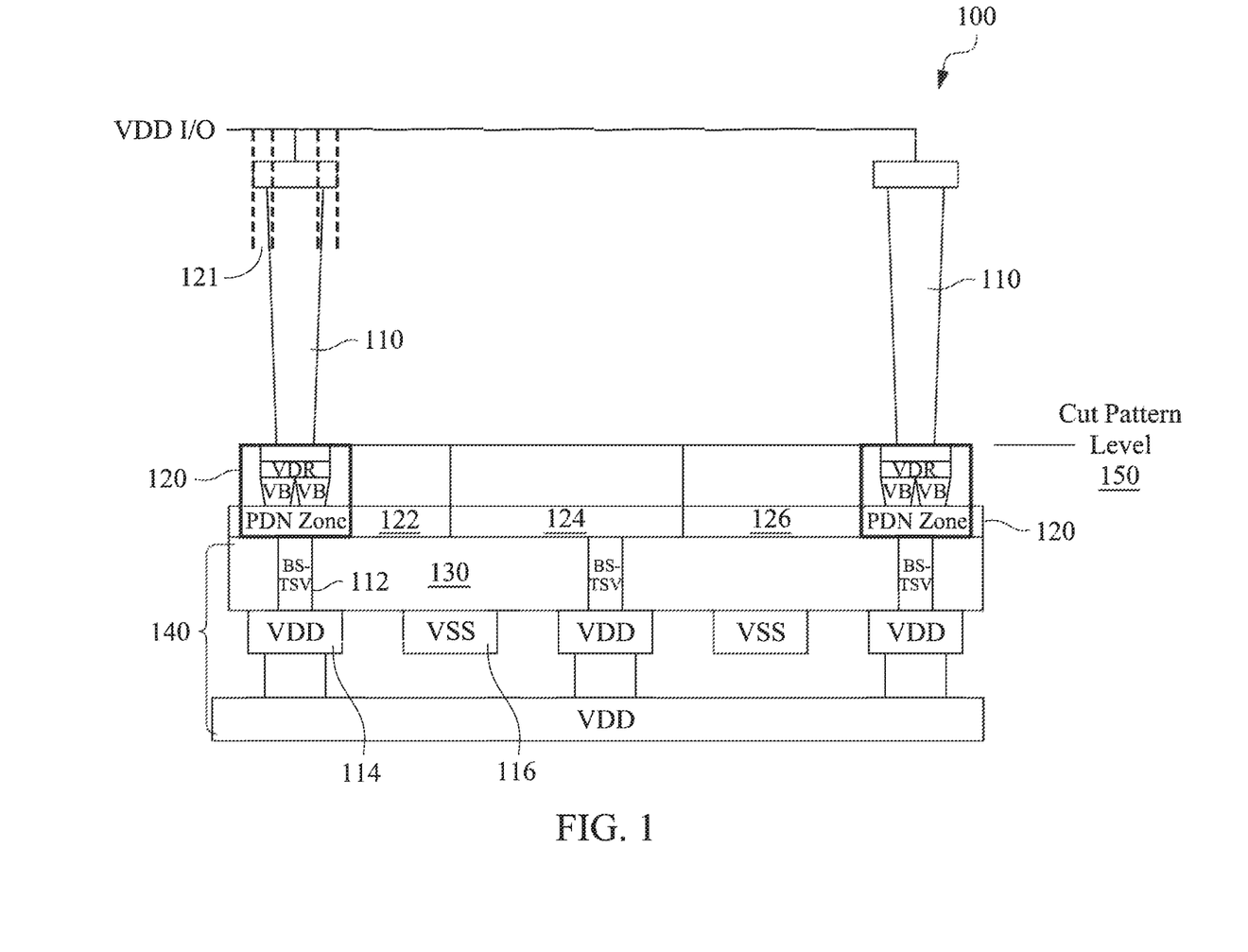
FIG. 1 is a schematic diagram of an exemplary semiconductor device in accordance with various embodiments of the present disclosure.

FIG. 1 is a side view of a schematic diagram of an exemplary semiconductor device 100 in accordance with various embodiments of the present disclosure. Semiconductor device 100 includes a number of through silicon vias (TSV) 110, a PDN zone 120, one or more circuits 122, 124, 126, a substrate 130, and a backside PDN 140. Backside PDN 140 can be made of backside TSVs 112 and voltage sources 114, 116. Backside PDN 140 can be formed underneath substrate 130 to save space on the top side of substrate 130 for additional circuit formation. The voltage sources 114, 116 (e.g., VDD, VSS) power the PDN zones 120 on the top side of the substrate 130. More specifically, the backside TSVs 112 can be coupled to the backside PDN 140 and route power through substrate 130, to the top side of substrate 130 (e.g., to PDN zones 120 or to the circuits as illustrated in FIG. 1 with circuit 124). PDN zones 120 can provide power to the one or more circuits 122, 124, 126. Routing pin access for semiconductor device 100 can be fabricated at the cut pattern level 150 illustrated in FIG. 1. The cut pattern level 150 is a defined height of semiconductor device 100 in a cross-sectional view.

As illustrated in FIG. 1, TSV 110 can be a trapezoid shape in a cross-sectional view. The trapezoid shape results from the etching process. TSV 110 is etched from top to bottom. The etching time (e.g., the amount of time that the etching substance is in contact with the material being etched) of the top of TSV 110 is longer than that of the bottom. In order to ensure that there is enough etching space on the top side, a via enclosure 121 is defined on either side of the via.

Figure 2A:
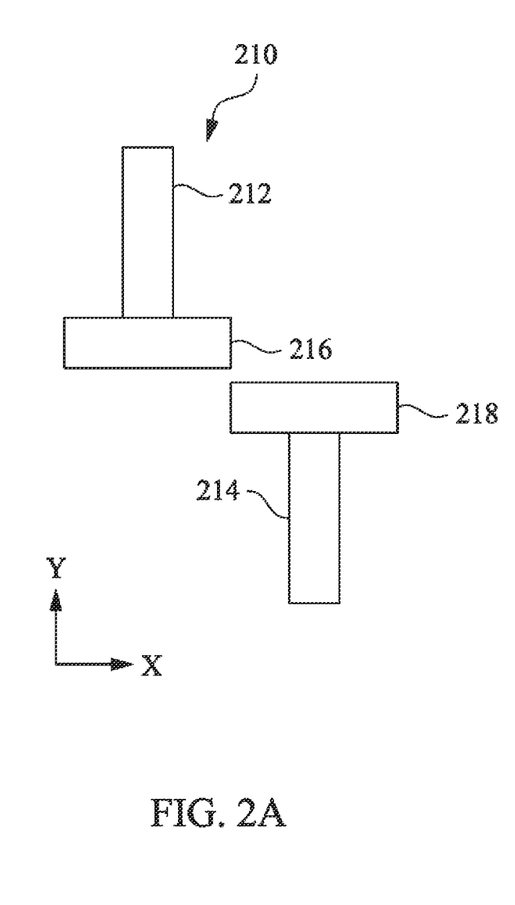
FIG. 2A illustrates a top view of an exemplary target pattern in accordance with various embodiments of the present disclosure.
Figure 2B:
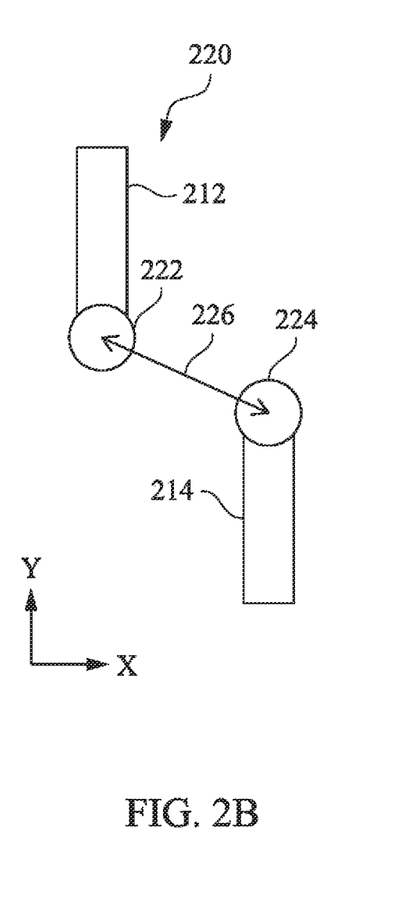
FIG. 2B illustrates a top view of an exemplary first patterning method in accordance with various embodiments of the present disclosure.
Figure 2C:
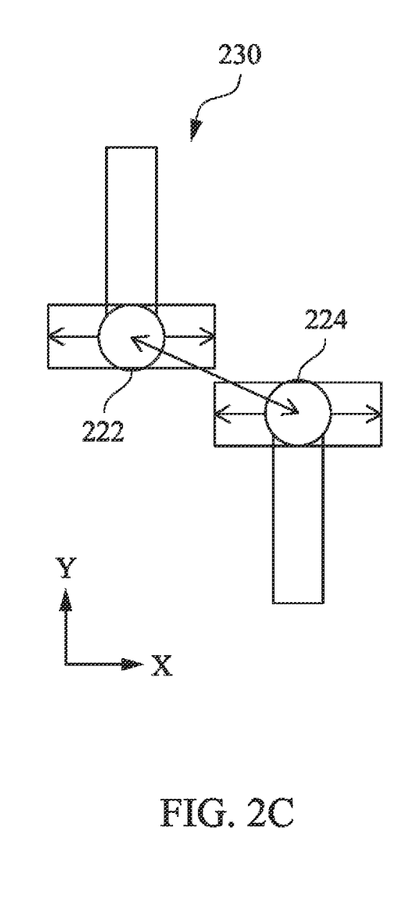
FIG. 2C illustrates a top view of an exemplary second patterning method in accordance with various embodiments of the present disclosure.

FIGS. 2A-2C illustrate schematic diagrams of an exemplary random cut patterning of semiconductor device 100 at the cut pattern level in accordance with various embodiments of the present disclosure. Use of the random cut patterning described in FIGS. 2A-2C creates pin access routing points within semiconductor device 100. FIG. 2A illustrates a top view of an exemplary target pattern 210 having metal lines 212, 214 and cut locations 216, 218 in accordance with various embodiments of the present disclosure. The number of routing access points increases the closer together the cut locations 216, 218 are to each other without touching, as touching of these metal lines can result in an electrical short. FIG. 2B illustrates a top view of an exemplary first patterning method 220 in accordance with various embodiments of the present disclosure. In some embodiments, the first patterning method is a square hole push. In other words, a number of holes (or circles) are generated at one end of each of the metal lines 212, 214 (e.g., holes 222, 224, respectively) using an ultraviolet (UV) mask or extreme ultraviolet (EUV) lithography. The pitch (e.g., center-to-center spacing between holes 222, 224) is minimized to increase the number of routing access points of the semiconductor device 100. In some embodiments, a minimized pitch may be between approximately 40-50 nm. The pitch may be dictated by the type of mask used during etching and/or etching design rules. FIG. 2C illustrates a top view of an exemplary second patterning method 230 in accordance with various embodiments of the present disclosure. In some embodiments, the second patterning method is directional or lateral etching. Lateral etching is performed on each side of the holes 222, 224 to increase the hole size laterally (e.g., illustrated as horizontally in FIG. 2C). The combination of square push hole etching in FIG. 2B and directional or lateral etching in FIG. 2C achieves the target pattern illustrated in FIG. 2A.

Figure 3:
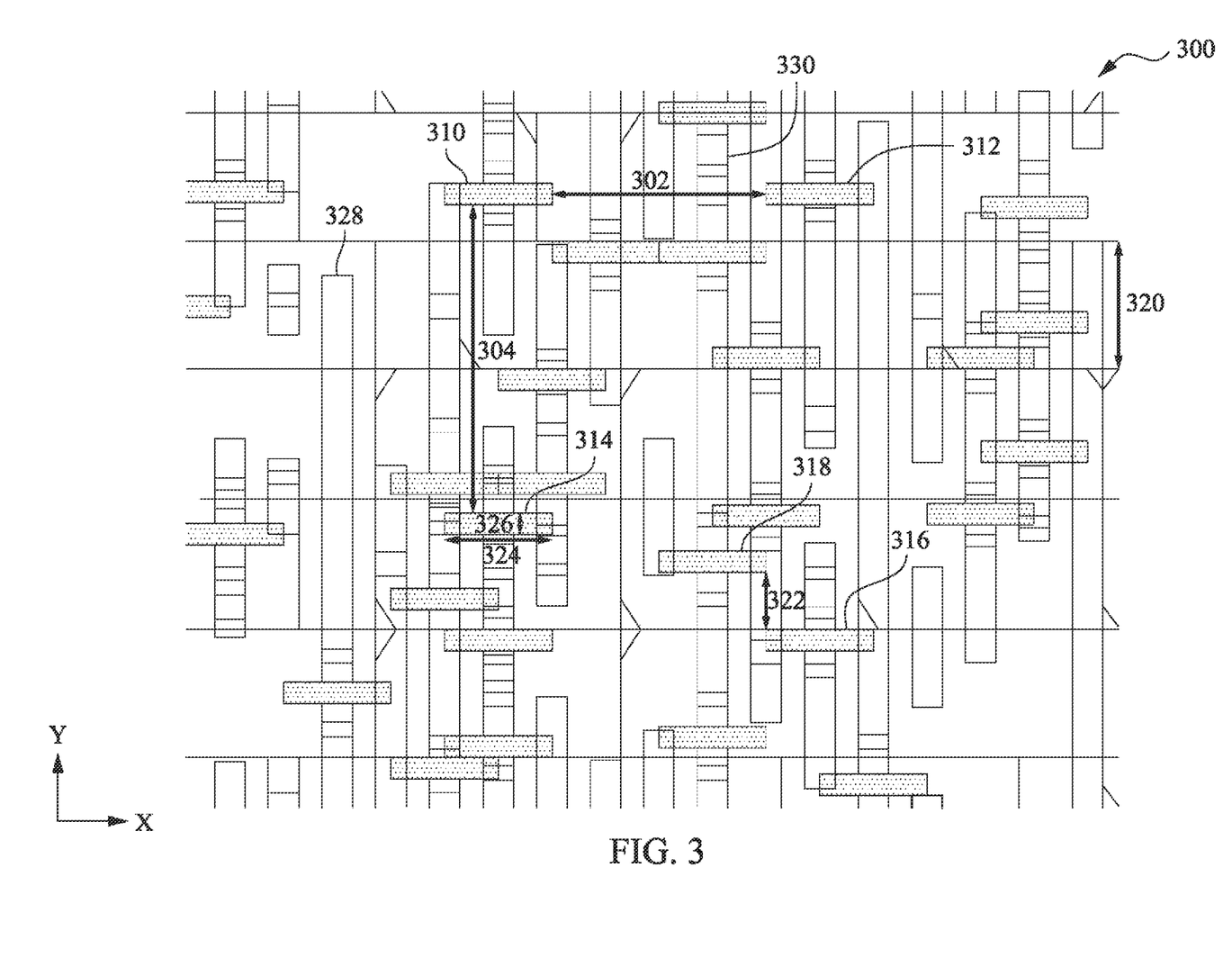
FIG. 3 is a top view of an exemplary cell layout in accordance with various embodiments of the present disclosure.

FIG. 3 is a top view of an exemplary cell layout 300 in accordance with various embodiments of the present disclosure. Cell layout 300 can include a number of cut locations (e.g., cut locations 310, 312, 314, 316, 318) which span across multiple cells of cell height 320 and a number of metal lines (e.g., metal line 330). Cell layout 300 can also include metal lines fabricated using a double patterning process, such as metal line 328. In this example, cut locations 310, 312, 314, 316, 318 extend horizontally (e.g., along the x-direction) and metal line 330 extends vertically (e.g., along the y-direction). Each metal line follows one preferred direction (e.g., a metal line is either horizontally oriented or vertically oriented). A pin access point for routing can occur where a horizontally oriented cut location crosses a vertically oriented metal line, so long as (i) one of the metal lines is not occupied by another signal and (ii) the distance between the via to metal line is greater than the via enclosure. The pin access point will be discussed in more detail in FIG. 4.

Cut locations 310, 312, 314, 316, 318 are fabricated using the directional or lateral etching described in FIG. 2C. Each cut location, such as cut location 314, has a length 324 defined by the directional or lateral etching as described in FIG. 2C and a height 326 defined by the diameter of the hole fabricated during the first patterning method as described in FIG. 2B. Metal line 330 can be fabricated using UV or EUV lithography. For purposes of explanation, an end of one of the cut locations extending horizontally can be defined as an end which extends in the y-direction. A bottom or top of one of the cut locations extending horizontally can be defined as bottom or top surface which extends in the x-direction. A distance spanning horizontally (e.g., along the x-direction) between one end of cut location 310 to an end of cut location 312 is the end-to-end space 302. A distance spanning vertically (e.g., along the y-direction) between a bottom surface of cut location 310 and a top surface of cut location 314 is the run-to-run space 304. When two opposite ends of cut locations align in the vertical direction (e.g., align within the y-direction), such as the ends of cut locations 316, 318, the distance spanning vertically (e.g., along the y-direction) between a bottom surface of cut location 318 and a top surface of cut location 316 is the jog 322.

Figure 4:
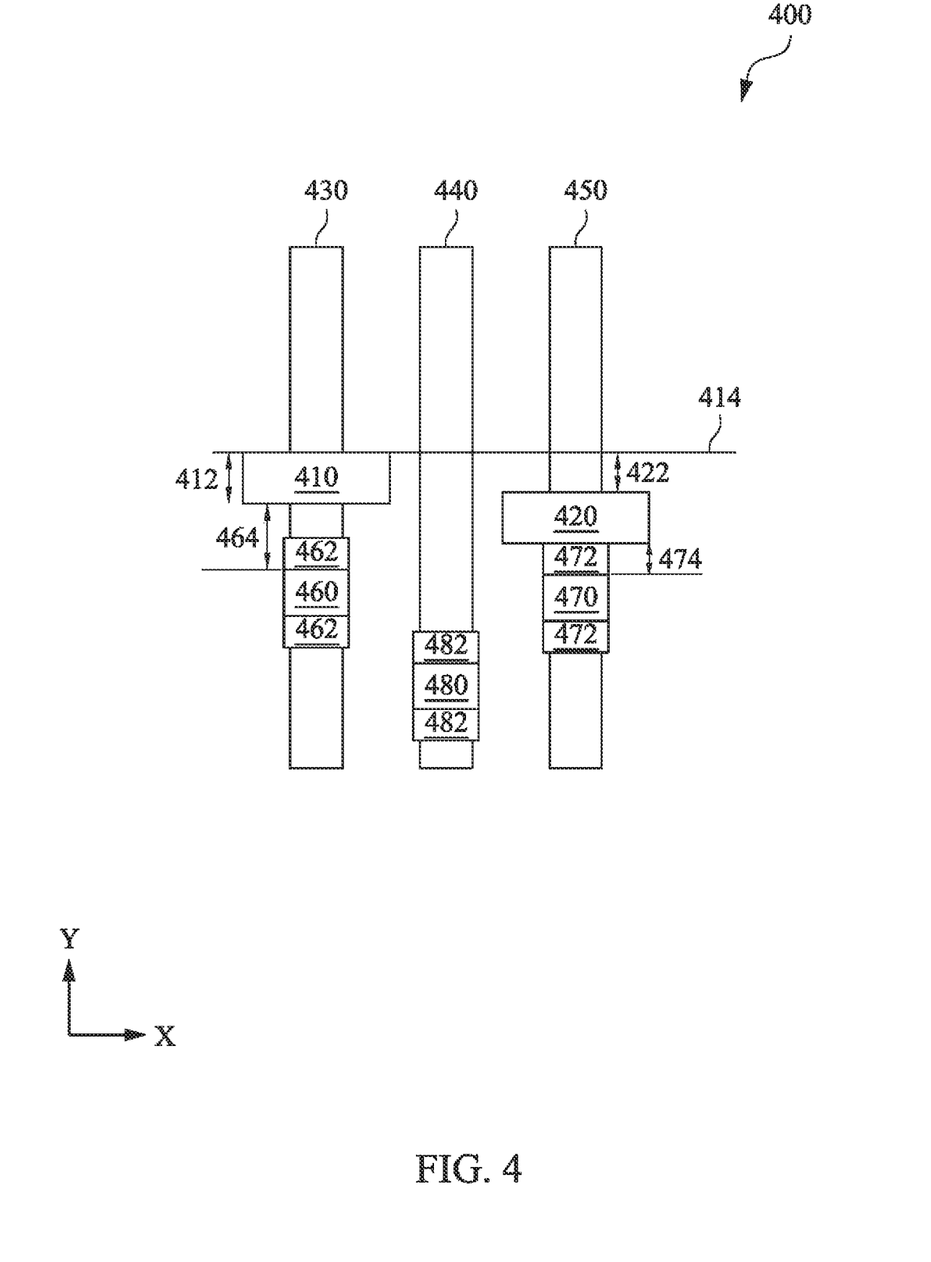
FIG. 4 is a simplified top view of an exemplary cell layout using random cut patterning in accordance with various embodiments of the present disclosure.

FIG. 4 is a simplified top view of an exemplary cell layout 400 using random cut patterning in accordance with various embodiments of the present disclosure. Cell layout 400 includes cut locations 410, 420 which extend horizontally in the x-direction and metal lines 430, 440, 450 which extend vertically in the y-direction. Each cut location which extends horizontally in the x-direction, such as cut location 410, has a length defined by the directional or lateral etching as described in FIG. 2C and a height 412 defined by the diameter of the hole fabricated during the first patterning method as described in FIG. 2B. Metal lines 430, 440, 450 can be fabricated using UV or EUV lithography. With random cut patterning, a shorter overall cell height does not impede pin access. A first reference line can be defined at any horizontal point in a cell layout. By way of example in FIG. 4, a reference line 414 is defined at a top surface of cut location 410. In cell layout 400, the distance 422 between reference line 414 and a top surface of cut location 420 is less than height 412 of cut location 410.

As previously described, a pin access point for routing can occur where a horizontally oriented metal line crosses a vertically oriented metal line, so long as (i) one of the metal lines is not occupied by another signal and (ii) the distance between the via to metal line is greater than the via enclosure. A number of vias 460, 470, 480 are illustrated in FIG. 4, along with corresponding via enclosures 462, 472, 482. By way of example, via 480 is occupied by a signal (e.g., signal A). With via 480 occupied by another signal, a pin access point cannot be placed at the intersection of metal line 440 and any other metal line coupled to metal line 440 using via 480. Similarly, a pin access point may not be placed at the intersection of metal lines 420, 450 as the distance 474 between via 470 to a bottom surface of cut location 420 is not greater than the height of via enclosure 472. Rather, the distance 474 is approximately equal to the height of via enclosure 472. A pin access point can be placed, however, at the intersection of cut location 410 and metal line 430. In this example, cut location 410 is not occupied by any other signal and, as illustrated in FIG. 4, the distance 464 between via 460 and a bottom surface of cut location 410 is greater than the height of via enclosure 462.

Figure 5:
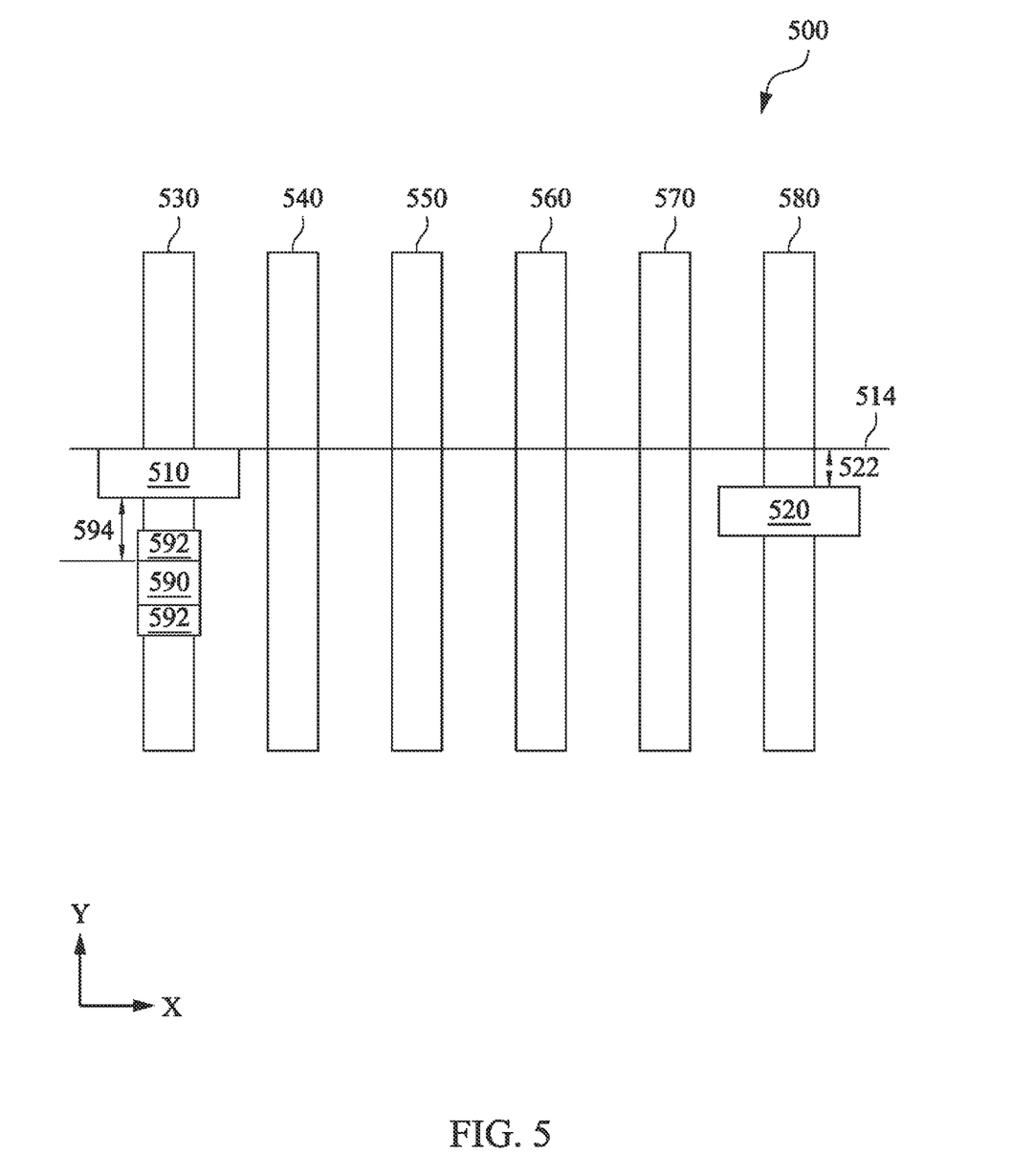
FIG. 5 is a simplified top view of an exemplary cell layout using random cut patterning in accordance with various embodiments of the present disclosure.

FIG. 5 is a simplified top view of an exemplary cell layout 500 using random cut patterning in accordance with various embodiments of the present disclosure. Cell layout 500 includes cut locations 510, 520 which extend horizontally in the x-direction and metal lines 530, 540, 550, 560, 570, 580 which extend vertically in the y-direction. Each cut location which extends horizontally in the x-direction, such as cut location 510, has a length defined by the directional or lateral etching as described in FIG. 2C and a height 512 defined by the diameter of the hole fabricated during the first patterning method as described in FIG. 2B. Metal lines 530, 540, 550, 560, 570, 580 can be fabricated using UV or EUV lithography. With random cut patterning, a shorter overall cell height does not impede pin access. A reference line can be defined at any horizontal point in a cell layout. By way of example in FIG. 5, a reference line 514 is defined at a top surface of cut location 510. In cell layout 500, the distance 522 between reference line 514 and a top surface of cut location 520 is less than two times the height 512 of cut location 510.

As illustrated in FIG. 5, pin access points can be placed at the intersection of cut location 510 and metal line 530 so long as cut location 510 is not occupied by another signal. The distance 594 between via 590 and a bottom surface of cut location 510 is greater than a height of via enclosure 592.

Figure 6:
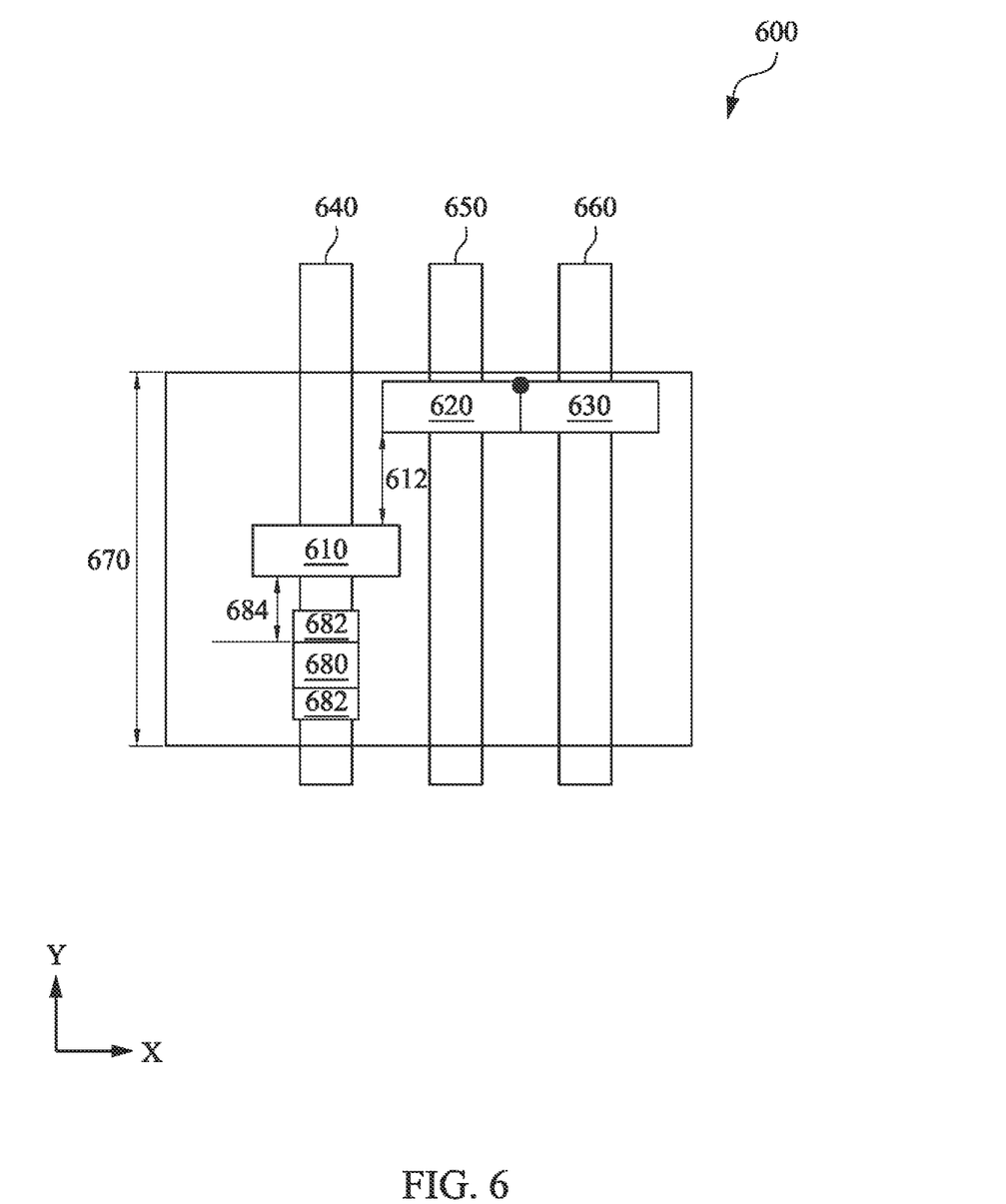
FIG. 6 is a simplified top view of an exemplary cell layout using random cut patterning in accordance with various embodiments of the present disclosure.

FIG. 6 is a simplified top view of an exemplary cell layout 600 using random cut patterning in accordance with various embodiments of the present disclosure. Cell layout 600 includes cut locations 610, 620, 630 which extend horizontally in the x-direction and metal lines 640, 650, 660 which extend vertically in the y-direction. Each cut location which extends horizontally in the x-direction, such as cut location 610, has a length defined by the directional or lateral etching as described in FIG. 2C and a height defined by the diameter of the hole fabricated during the first patterning method as described in FIG. 2B. Metal lines 640, 650, 660 can be fabricated using UV or EUV lithography. With random cut patterning, a shorter overall cell height does not impede pin access. Cell 600 has a cell height 670 (e.g., 50 nm-100 nm). In this example, a distance 612 between a top surface of cut location 610 and a bottom surface of cut location 620 is less than half of the cell height 670.

As illustrated in FIG. 6, pin access points can be placed at the intersection of cut location 610 and metal line 640 so long as cut location 610 is not occupied by another signal. The distance 684 between via 680 and a bottom surface of cut location 610 is greater than a height of via enclosure 682.

Figure 7:
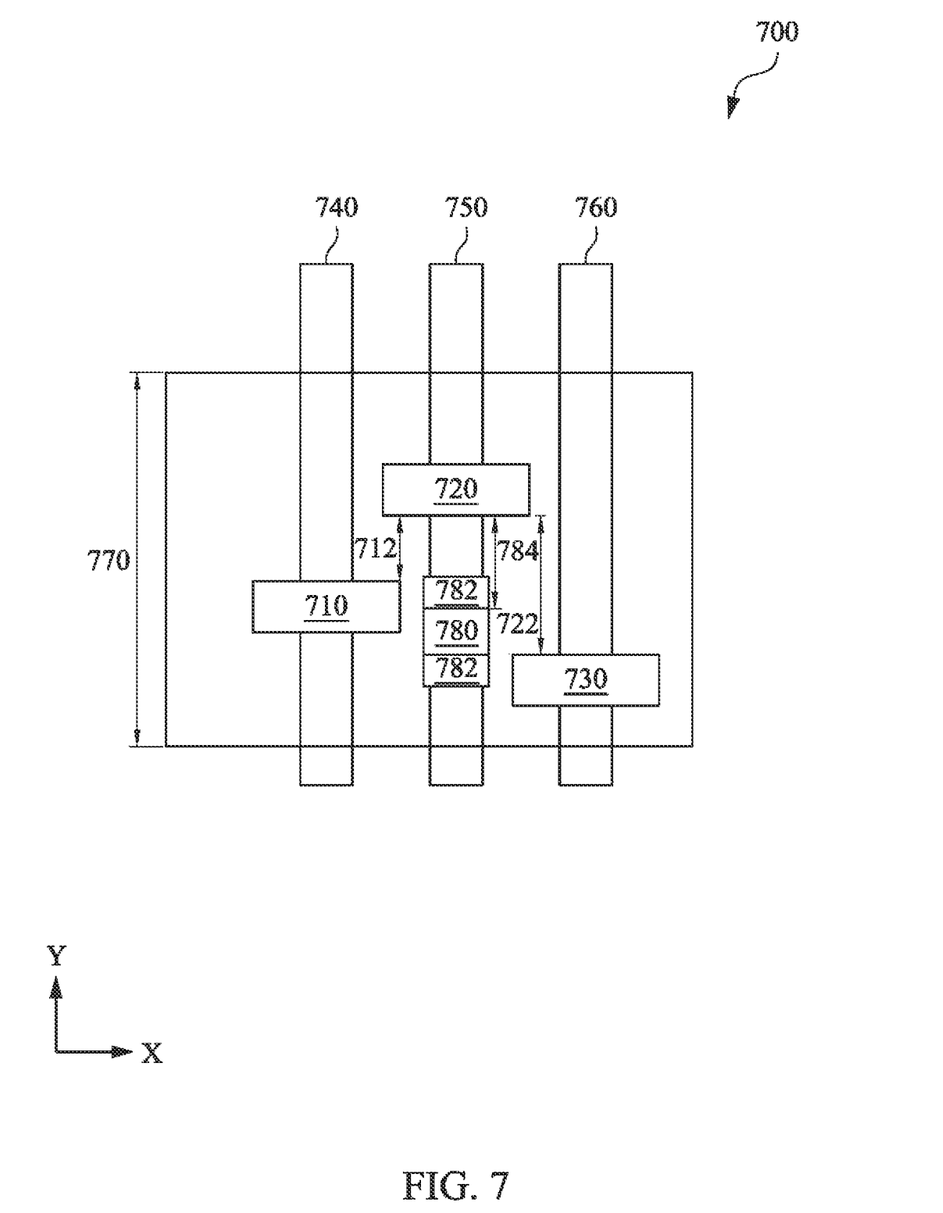
FIG. 7 is a simplified top view of an exemplary cell layout using random cut patterning in accordance with various embodiments of the present disclosure.

FIG. 7 is a simplified top view of an exemplary cell layout 700 using random cut patterning in accordance with various embodiments of the present disclosure. Cell layout 700 includes cut locations 710, 720, 730 which extend horizontally in the x-direction and metal lines 740, 750, 760 which extend vertically in the y-direction. Each cut location which extends horizontally in the x-direction, such as cut location 710, has a length defined by the directional or lateral etching as described in FIG. 2C and a height defined by the diameter of the hole fabricated during the first patterning method as described in FIG. 2B. Metal lines 740, 750, 760 can be fabricated using UV or EUV lithography. With random cut patterning, a shorter overall cell height does not impede pin access. Cell 700 has a cell height 770 (e.g., 50-100 nm). In this example, a distance 712 between a top surface of cut location 710 and a bottom surface of cut location 720 is less than half of the cell height 770. Similarly, a distance 722 between a top surface of cut location 730 and a bottom surface of cut location 720 is less than half of the cell height 770.

As illustrated in FIG. 7, pin access points can be placed at the intersection of cut location 720 and metal line 750 so long as cut location 720 is not occupied by another signal. The distance 784 between via 780 and a bottom surface of cut location 720 is greater than a height of via enclosure 782.

Figure 8:
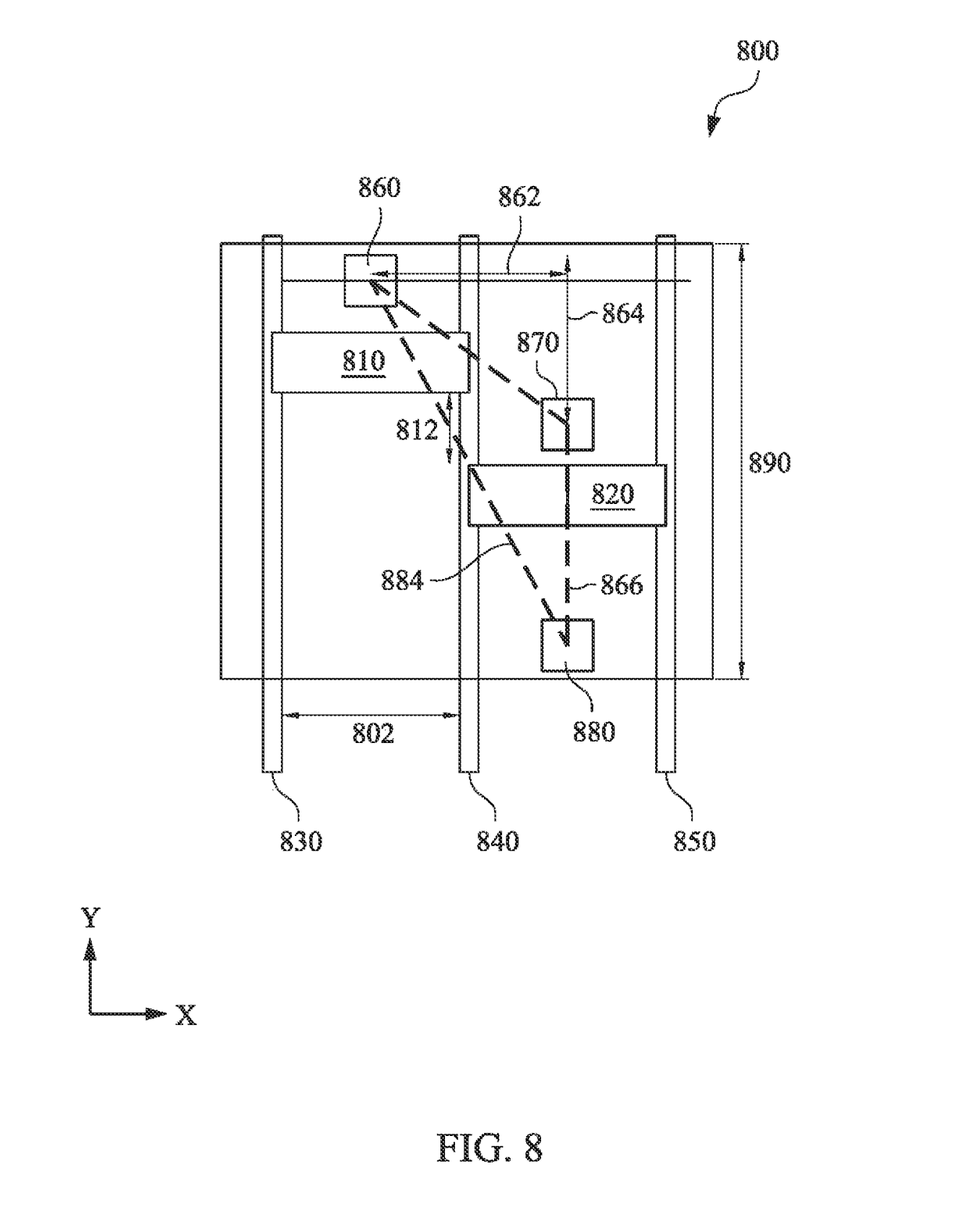
FIG. 8 is a simplified top view of an exemplary cell layout using random cut patterning in accordance with various embodiments of the present disclosure.

FIG. 8 is a simplified top view of an exemplary cell layout 800 using random cut patterning in accordance with various embodiments of the present disclosure. Cell layout 800 includes cut locations 810, 820 which extend horizontally in the x-direction, polycrystalline silicon (or poly) lines 830, 840, 850 which extend vertically in the y-direction, and vias 860, 870, 880. Each cut location which extends horizontally in the x-direction, such as cut location 810, has a length defined by the directional or lateral etching as described in FIG. 2C and a height defined by the diameter of the hole fabricated during the first patterning method as described in FIG. 2B. The distance between two poly lines is the poly pitch distance 802. Poly lines 830, 840, 850 can be fabricated using UV or EUV lithography. With random cut patterning, a shorter overall cell height does not impede pin access. Cell 800 has a cell height 890 (e.g., 50-100 nm). In this example, a distance 812 between a top surface of cut location 820 and a bottom surface of cut location 810 is less than half of the cell height 890. Use of the random cut patterning facilitates a unique via pattern 884, such as the one illustrated in FIG. 8. Via distances 862, 864, 866 can be used to defined relative position among vias 860, 870, 880. In the embodiment illustrated in FIG. 8, a via distance 862, horizontally between a center point of via 860 and a center point of via 880 can be represented by the following equation:

$$V0s_1 = 0.5 - 1 * Pp \qquad (1)$$

where $V0s_1$ represents the via distance 862 and Pp is the poly pitch distance 802. Similarly, via distances 864, 866, vertically, between a center point of via 860 and a center point of via 870 can be less than approximately half of the cell height 890 and represented by the following equation:

$$V0s_2 = V0s_3 < 0.5 * CH \qquad (2)$$

where $V0s_2$ represents the via distance 864, $V0s_3$ represents the via distance 866, and CH represents cell height 890.

Figure 9:
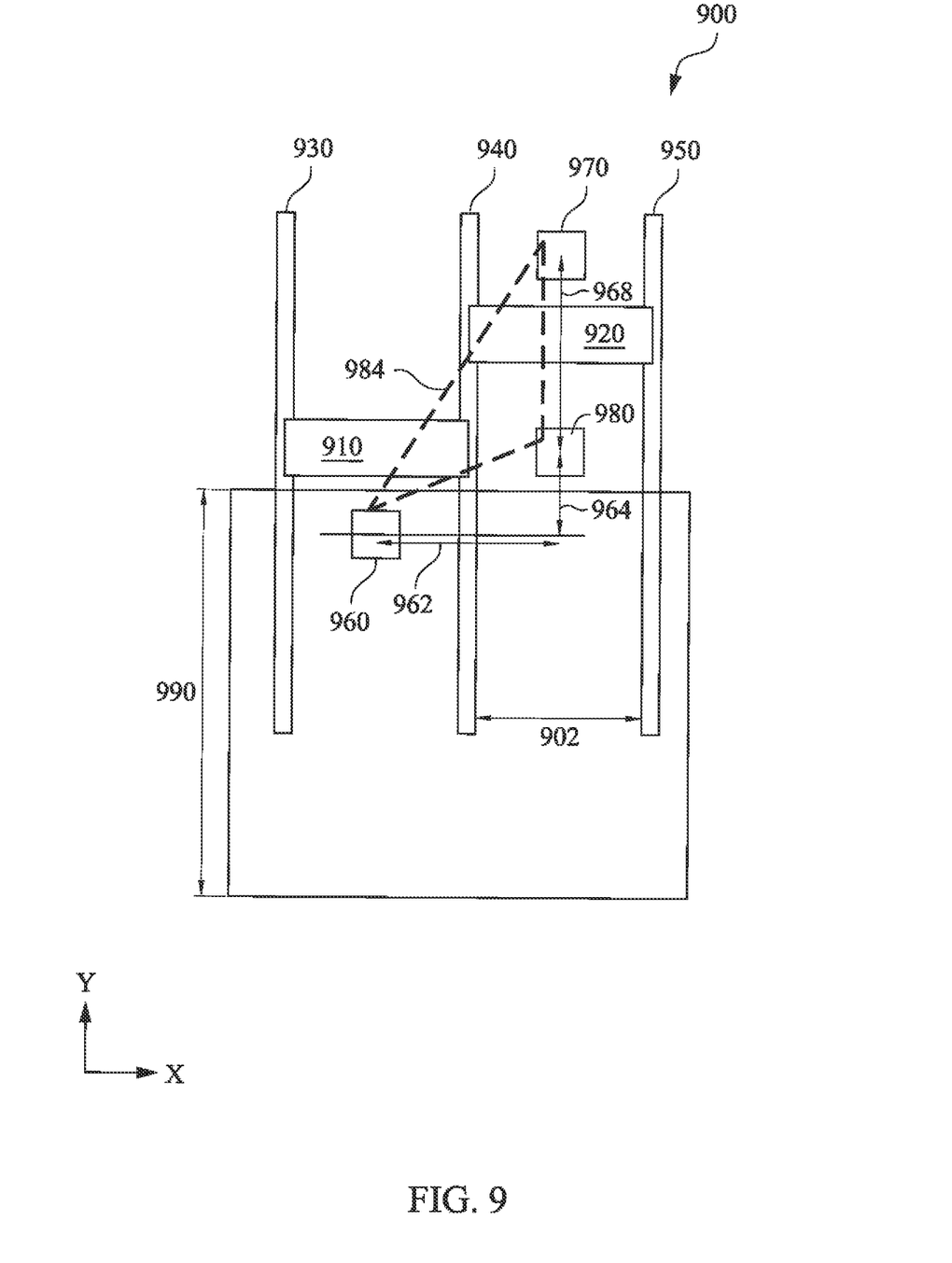
FIG. 9 is a simplified top view of an exemplary cell layout using random cut patterning in accordance with various embodiments of the present disclosure.

FIG. 9 is a simplified top view of an exemplary cell layout 900 using random cut patterning in accordance with various embodiments of the present disclosure. Cell layout 900 includes cut locations 910, 920 which extend horizontally in the x-direction, poly lines 930, 940, 950 which extend vertically in the y-direction, and vias 960, 970, 980. Each cut location which extends horizontally in the x-direction, such as cut location 910, has a length defined by the directional or lateral etching as described in FIG. 2C and a height defined by the diameter of the hole fabricated during the first patterning method as described in FIG. 2B. The distance between two poly lines is the poly pitch distance 902. Poly lines 930, 940, 950 can be fabricated using UV mask etching. With random cut patterning, a shorter overall cell height does not impede pin access. Cell 900 has a cell height 990 (e.g., 50-100 nm). In this example, a distance 912 between a top surface of cut location 910 and a bottom surface of cut location 920 is less than half of the cell height 990. Use of the random cut patterning facilitates a unique via pattern 984, such as the one illustrated in FIG. 9. Via distances 962, 964, 966 can be used to defined relative position among vias 960, 970, 980. In the embodiment illustrated in FIG. 9, a via distance 962, horizontally between a center point of via 960 and a center point of via 970 can be represented by the following equation:

$$V0s_1 = 0.5 - 1*Pp \quad (3)$$

where $V0s_1$ represents the via distance 962 and Pp is the poly pitch distance 902. Similarly, via distances 964, 966, vertically, between a center point of via 960 and a center point of via 970 can be less than approximately half of the cell height 990 and represented by the following equation:

$$V0s_2 = V0s_3 < 0.5*CH \quad (4)$$

where $V0s_2$ represents the via distance 964, $V0s_3$ represents the via distance 966, and CH represents cell height 990.

Fabrication of semiconductor device 100 can begin with an initial design layout, including cell design. For example, cell definitions can include a cell height, a type of power distribution design, and a pin style. Various etching rules can also be defined for the various etch processed used to fabricate semiconductor device 100. With the initial design, the power distribution components can be fabricated such as TSV 110, backside TSV 112, power sources 114, 116, and backside PDN 140. After fabrication of the power distribution components, patterning masks can be generated to block out cell placement for locations on substrate 130 that contain the power distribution components. Fabrication of one or more circuits 122, 124, 126 can then begin using these patterned masks. Clocks within any of the one or more circuits 122, 124, 126 can be synchronized together, during a circuit layout design phase, using one or more clock synchronization techniques (e.g., clock tree synthesis which distributes a common clock signal for an integrated circuit design within timing constraints that are determined by selection and arrangement of clocked logic elements in the circuit design). With the clocks synchronized, random cut patterning can be initiated as described in more detail in FIG. 10.

Figure 10:
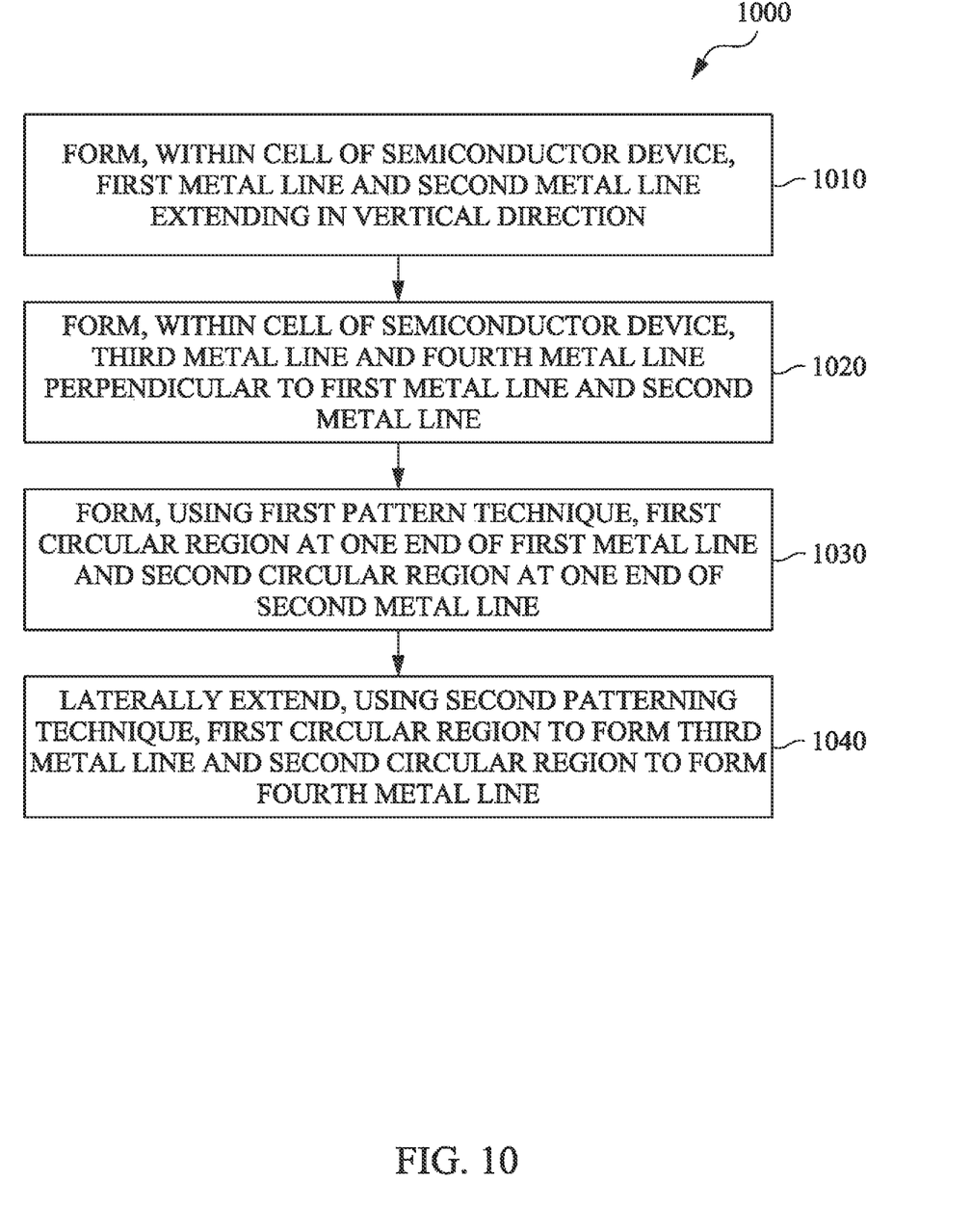
FIG. 10 is a flow chart 1000 of an exemplary method of random cut patterning in accordance with various embodiments of the present disclosure.

FIG. 10 is a flow chart 1000 of an exemplary method of random cut patterning in accordance with various embodiments of the present disclosure. The method is applicable to a wide variety of underlying structures. But for ease of understanding, the steps of FIG. 10 are described with reference to structures depicted in FIGS. 2A-9. A first metal line and a second metal line is formed, at 1010 within a cell of a semiconductor device, extending in a vertical direction. A third metal line and a fourth metal line are formed, at 1020, perpendicular to the first metal line and the second metal line, respectively. A first circular region is formed using a first patterning technique (e.g., UV mask etching or EUV lithography), at 1030, at one end of the first metal line and a second circular region at one end of the second metal line. The first circular region is laterally extended using a second patterning technique (e.g., directional or lateral etching), at 1040, to form the third metal line and the second circular region to form the fourth metal line.

Use of the various circuits and configurations as described herein can ensure that voltage drops of semiconductor devices are minimized as the devices (e.g., cell heights) continue to decrease in size. Additionally, routing impacts can be minimized due the decreasing device sizes use of the random cut patterning coupled with the backside PDN design. With use of random cut patterning, the cut metal lines can be close enough to facilitate pin access while not shorting out one or more components of the semiconductor device.

In one embodiment, a first metal line and a second metal line are formed within a cell of a semiconductor device. The first and second metal line each extend in a vertical direction. A third metal line and a fourth metal line are formed perpendicular to the first metal line and the second metal line, respectively. A first circular region is formed using a first patterning technique at one end of the first metal line and a second circular region is formed at one end of the second metal line. The first circular region is laterally extended using a second patterning technique to form the third metal line and the second circular region is laterally extended using a second patterning technique to form the fourth metal line.

In another embodiment, a semiconductor device includes a cell having a first metal line and a second metal line formed extending in a vertical direction. The cell also includes a third metal line and a fourth metal line formed perpendicular to the first metal line and the second metal line. The third metal line and the fourth metal line are formed by forming, using a first patterning technique, a first circular region at one end of the first metal line and a second circular region at one end of the second metal line. Using a second patterning technique, the first circular region is laterally extended to form the third metal line and the second circular region is laterally extended to form the fourth metal line.

In yet another embodiment, a first metal line and a second metal line are formed on a substrate and extend in a vertical direction. A third metal line and a fourth metal line are formed perpendicular to the first metal line and the second metal line, respectively. A first circular region is formed, using a first patterning technique, at one end of the first metal line and a second circular region is formed, using the first patterning technique, at one end of the second metal line. The first circular region is laterally extended using a second patterning technique to form the third metal line and the second circular region is laterally extended using the second patterning technique to form the fourth metal line. Electrical signals are routed throughout the semiconductor device using the first metal line, the second metal line, the third metal line, and the fourth metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An semiconductor device comprising: a cell having:
   a first metal line and a second metal line formed extending in a vertical direction; and
   a third metal line and a fourth metal line formed perpendicular to the first metal line and the second metal line by:
      forming, using a first patterning technique, a first circular region at one end of the first metal line and a second circular region at one end of the second metal line; and laterally extending, using a second patterning technique, the first circular region to form the third metal line and the second circular region to form the fourth metal line;

wherein a reference line is defined to extend from a top surface of the third metal line, and wherein a distance between the reference line and a top of the fourth metal line is less than two times a height of the third metal line.

2. The semiconductor device of claim 1, wherein the first patterning technique comprises ultraviolet mask etching and the second patterning technique comprises directional etching.

3. The semiconductor device of claim 1, wherein a center-to-center distance between a center of the first circular region to a center of the second circular region is less than 50 nm.

4. The semiconductor device of claim 1, further comprising:
a substrate;
a backside power distribution network formed underneath the substrate, the backside power distribution network configured to power electrical components; and
a through silicon via coupled to the backside power distribution network, the through silicon via configured to provide power to at least two circuits on a front side of the semiconductor device.

5. The semiconductor device of claim 4, further comprising forming at least two circuits on the top of the substrate, the at least two circuit receiving power from the through silicon via.

6. The semiconductor of claim 1, wherein a height of the cell is less than 100 nm.

7. The semiconductor device of claim 1, wherein a distance between a bottom surface of the fourth metal line and a top surface of the third metal line is less than half of a height of the cell.

8. The semiconductor device of claim 1, further comprising:
a fifth metal line extending in a vertical direction;
a sixth metal line perpendicular to the fifth metal line, the sixth metal line formed by:
forming, using the first patterning technique, a third circular region located at one end of the fifth metal line; and
laterally extending, using the second patterning technique, the third circular region to form the sixth metal line, and
wherein a distance between a bottom surface of the sixth metal line and a top surface of the fourth metal line is less than half of a height of the cell.

9. The semiconductor device of claim 3, wherein the center-to-center distance is 40 nm.

10. An semiconductor device comprising:
on a substrate of the semiconductor device, a first metal line and a second metal line extending in a vertical direction; and
on the substrate, a third metal line and a fourth metal line extending in a horizontal direction perpendicular to the first metal line and the second metal line, formed respectively by:
forming, using a first patterning technique, a first circular region located at one end of the first metal line and a second circular region at one end of the second metal line;
laterally extending, using a second patterning technique, the first circular region to the third metal line; and
laterally extending, using the second patterning technique, the second circular region to the fourth metal line; and
a backside power distribution network underneath the substrate, wherein the backside power distribution network is configured to power electrical components.

11. The semiconductor device of claim 10, wherein electrical signals are routed throughout the semiconductor device using the first metal line, the second metal line, the third metal line, and the fourth metal line.

12. The semiconductor device of claim 10, wherein the first patterning technique is extreme ultraviolet lithography.

13. The semiconductor device of claim 10, further comprising:
a through silicon via coupled to the backside power distribution network, wherein the through silicon via is configured to provide power to at least two circuits on a front side of the semiconductor device.

14. The semiconductor device of claim 13, further comprising:
at least two circuits on top of the substrate, wherein the at least two circuits receive power from the through silicon via.

15. The semiconductor device of claim 10, wherein the first patterning technique comprises at least one of ultraviolet mask etching and extreme ultraviolet lithography, and wherein the second patterning technique comprises at least one of directional etching and lateral etching.

16. An semiconductor device comprising:
a patterned first circular region at one end of a first metal line; and a patterned second circular region at one end of a second metal line; and
wherein the patterned first circular region extends to a third metal line; wherein the patterned second circular region extends to a fourth metal line; and wherein the third metal line and the fourth metal line extend in a horizontal direction perpendicular to the first metal line and the second metal line; and
a patterned third circular region at one end of a fifth metal line.

17. The semiconductor device of claim 16, wherein a center-center distance between a center of the first circular region to a center of the second circular region is less than 50 nm.

18. The semiconductor device of claim 16, wherein the height of the cell is 50 nm.

19. The semiconductor device of claim 16, wherein the patterned third circular region extends laterally to a sixth metal line perpendicular to the fifth metal line, and wherein a distance between a bottom surface of the sixth metal line and a top surface of the fourth metal line is less than half of a height of a cell.

20. The semiconductor device of claim 19, wherein the height of the cell is less than 100 nm.

* * * * *